(12) United States Patent
Abedifard

(10) Patent No.: US 6,445,625 B1
(45) Date of Patent: Sep. 3, 2002

(54) MEMORY DEVICE REDUNDANCY SELECTION HAVING TEST INPUTS

(75) Inventor: Ebrahim Abedifard, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 18 days.

(21) Appl. No.: 09/648,923

(22) Filed: Aug. 25, 2000

(51) Int. Cl.[7] .................................................. G11C 7/00
(52) U.S. Cl. .................. 365/200; 365/189.02; 365/201; 365/189.05
(58) Field of Search ................................. 365/200, 201, 365/225.7, 189.02, 230.02, 189.05

(56) References Cited

U.S. PATENT DOCUMENTS

| | | | |
|---|---|---|---|
| 4,992,985 A | * | 2/1991 | Miyazawa et al. .......... 365/193 |
| 5,041,886 A | | 8/1991 | Lee |
| 5,257,229 A | | 10/1993 | McClure et al. |
| 5,377,146 A | | 12/1994 | Reddy et al. |
| 5,537,354 A | | 7/1996 | Mochizuki et al. |
| 5,600,605 A | | 2/1997 | Schaefer |
| 5,621,690 A | | 4/1997 | Jungroth et al. |
| 5,666,321 A | | 9/1997 | Schaefer |
| 5,732,030 A | | 3/1998 | Dorney |
| 5,734,620 A | | 3/1998 | Seyyedy |
| 5,742,549 A | | 4/1998 | Ochoa et al. |
| 5,751,039 A | | 5/1998 | Kauffman et al. |
| 5,787,097 A | | 7/1998 | Roohparvar et al. |
| 5,808,946 A | | 9/1998 | Roohparvar |
| 5,898,627 A | | 4/1999 | Yoshikawa |
| 5,910,181 A | | 6/1999 | Hatakenaka et al. |
| 5,920,514 A | | 7/1999 | Lim et al. |
| 5,936,903 A | | 8/1999 | Jeng et al. |
| 5,936,974 A | | 8/1999 | Roberts et al. |
| 5,995,419 A | * | 11/1999 | Trimberger ................. 365/154 |
| 5,995,438 A | | 11/1999 | Jeng et al. |
| 6,018,811 A | | 1/2000 | Merritt |
| 6,026,465 A | | 2/2000 | Mills et al. |
| 6,077,211 A | | 6/2000 | Vo |
| 6,084,807 A | | 7/2000 | Choi |
| 6,104,645 A | | 8/2000 | Ong et al. |
| 6,134,160 A | | 10/2000 | Waller et al. |
| 6,137,133 A | | 10/2000 | Kauffman et al. |
| 6,141,247 A | | 10/2000 | Roohparvar et al. |
| 6,314,036 B1 | * | 11/2001 | Cooper et al. ......... 365/189.02 |

OTHER PUBLICATIONS

Keeth, et al., "DRAM circuit design: a tutorial," IEEE Press, 2001, pp. 16–23, 142–153.
Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.
Micron, "16 Mb: x16 SDRAM" *Synchronous DRAM*, www.micron.com, copyright 1999 Micron Technology, Inc., pp. 1–51.

* cited by examiner

*Primary Examiner*—Son T. Dinh
(74) *Attorney, Agent, or Firm*—Thomas W. Leffert; Fogg Slifer Polglaze Leffert & Jay PA

(57) ABSTRACT

Memory devices having redundancy selection circuitry are adapted to introduce test input signals into the redundancy selection path. The memory devices include a redundancy selection circuit having a latch for latching an incoming redundancy match signal. The latch includes a pair of reverse-coupled inverters. The latch is further coupled to receive one or more test input signals. The latch is responsive to one or more control signals to selectively generate the latched match signal from the incoming redundancy match signal or one of the test input signals. When the latched match signal is generated from the incoming redundancy match signal, the logic level of the latched match signal is independent of the logic level of any of the test input signals. When the latched match signal is generated from one of the test input signals, the logic level of the latched match signal is independent of the logic level of the incoming redundancy match signal. Such latch circuits are useful for controlling selection of a redundant element in a memory device during testing without significantly impacting the speed path of the redundancy selection circuitry during normal operation of the memory device.

38 Claims, 11 Drawing Sheets

| Pin | Signal | | Pin | Signal |
|---|---|---|---|---|
| 1* | Vcc | | 54 | Vss |
| 2 | DQ0 | | 53 | DQ15 |
| 3 | VccQ | | 52 | VssQ |
| 4 | DQ1 | | 51 | DQ14 |
| 5 | DQ2 | | 50 | DQ13 |
| 6 | VssQ | | 49 | VccQ |
| 7 | DQ3 | | 48 | DQ12 |
| 8 | DQ4 | | 47 | DQ11 |
| 9 | VccQ | | 46 | VssQ |
| 10 | DQ5 | | 45 | DQ10 |
| 11 | DQ6 | | 44 | DQ9 |
| 12 | VssQ | | 43 | VccQ |
| 13 | DQ7 | | 42 | DQ8 |
| 14 | Vcc | | 41 | Vss |
| 15 | DQML | | 40 | RP# |
| 16 | WE# | | 39 | DQMH |
| 17 | CAS# | | 38 | CLK |
| 18 | RAS# | | 37 | CKE |
| 19 | CS# | | 36 | VccP |
| 20 | BA0 | | 35 | A11 |
| 21 | BA1 | | 34 | A9 |
| 22 | A10 | | 33 | A8 |
| 23 | A0 | | 32 | A7 |
| 24 | A1 | | 31 | A6 |
| 25 | A2 | | 30 | A5 |
| 26 | A3 | | 29 | A4 |
| 27 | Vcc | | 28 | Vss |

*Fig. 2A*

MEMORY DEVICE REDUNDANCY SELECTION HAVING TEST INPUTS

TECHNICAL FIELD OF THE INVENTION

The present invention relates generally to semiconductor memory devices, and in particular, the present invention relates to redundancy selection in non-volatile semiconductor memory devices and associated circuitry for providing test inputs.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

Redundancy is a method of incorporating spare or redundant devices on a semiconductor die that can be used to replace defective devices. Redundancy is widely used in high density memory devices to improve production yield. As an example, a memory device may have redundant elements, such as redundant memory cells, redundant rows of memory cells or redundant columns of memory cells. If a primary element is determined to be defective, the defective element may be replaced by a redundant element by redirecting the address of the defective element to the redundant element in a manner known in the art. By replacing the defective element, an otherwise unusable memory device becomes commercially acceptable. Redundancy generally introduces additional complexity and speed delay to the memory device.

During manufacturing testing of the memory device, it may be desirable to temporarily enable one or more of the redundant elements in response to one or more test input signals. Such temporary enabling typically involves the introduction of test input signals into the redundancy selection path. Providing for temporary enabling of a redundant element generally entails additional logic to process the test input signals. It is desirable that such enabling logic not introduce additional speed delay to the memory device.

For the reasons stated above, and for other reasons stated below which will become apparent to those skilled in the art upon reading and understanding the present specification, there is a need in the art for alternate integrated circuits to facilitate selection of redundant elements in semiconductor memory devices while providing for temporary enabling of such redundant elements during manufacturing testing of the memory device.

SUMMARY OF THE INVENTION

The above-mentioned problems with memory devices and other problems are addressed by the present invention and will be understood by reading and studying the following specification.

Memory devices having redundancy selection circuitry are described herein, with particular reference to synchronous non-volatile memory devices. The memory devices include a redundancy selection circuit having a latch for latching an incoming redundancy match signal. The latch includes a pair of reverse-coupled inverters. The latch is further coupled to receive one or more test input signals. The latch is responsive to one or more control signals to selectively generate the latched match signal from the incoming redundancy match signal or one of the test input signals. When the latched match signal is generated from the incoming redundancy match signal, the logic level of the latched match signal is independent of the logic level of any of the test input signals. When the latched match signal is generated from one of the test input signals, the logic level of the latched match signal is independent of the logic level of the incoming redundancy match signal. Such latch circuits are useful for controlling selection of a redundant element in a memory device during testing without significantly impacting the speed path of the redundancy selection circuitry during normal operation of the memory device.

For one embodiment, the invention provides a redundancy match signal latch circuit. The latch circuit includes a pair of reverse-coupled inverters having a first inverter and a second inverter. The first inverter has at least one test input, each for receiving a test input signal. The latch circuit further includes a latch input for providing a redundancy match signal to the pair of reverse-coupled inverters and a latch output for providing a latched match signal from the pair of reverse-coupled inverters. The first inverter is responsive to one or more control signals to cause the pair of reverse-coupled inverters to generate the latched match signal from either the redundancy match signal or a test input signal. The logic level of the latched match signal is independent of the logic level of the redundancy match signal when the pair of reverse-coupled inverters generates the latched match signal from a test input signal. Furthermore, the logic level of the latched match signal is independent of the logic level of any test input signal when the pair of reverse-coupled inverters generates the latched match signal from the redundancy match signal.

For another embodiment, the invention provides a redundancy match signal latch circuit. The latch circuit includes a feedforward inverter having an input for receiving a first signal that is selectively either a redundancy match signal or a feedback signal, and an output for providing an inverted first signal as a feedforward signal. The latch circuit further includes a multiplexer having an inverted first input, a second input, and an output for providing the feedback signal. The inverted first input is coupled to receive the feedforward signal and each additional input is coupled to receive a test input signal. The multiplexer is responsive to at least one control signal to selectively couple its output to either the first input or one of the additional inputs.

For yet another embodiment, the invention provides a redundancy match signal latch circuit. The latch circuit includes a multiplexer having an inverted first input for receiving a first signal that is selectively either a redundancy match signal or a feedback signal. The multiplexer further includes at least one additional input, each for receiving a test input signal, and an output for providing a feedforward signal. The latch circuit further includes a feedback inverter having an input for receiving the feedforward signal and an output for providing the feedback signal as an inverted feedforward signal. The multiplexer is responsive to at least one control signal to selectively couple its output to either the first input or one of the additional inputs.

For a further embodiment, the invention provides a method of operating a memory device. The method includes latching a redundancy match signal in a reverse-coupled inverter latch, thereby generating a feedback signal and a feedforward signal. The redundancy match signal is indicative of a desire of whether to access a primary grouping of memory cells. The method further includes generating the feedforward signal from the feedback signal and selectively generating the feedback signal from either a test signal or the feedforward signal in response to a control signal. The method still further includes generating a latched match signal from the feedforward signal and selectively accessing either the primary grouping of memory cells or a redundant grouping of memory cells in response to the latched match signal.

The invention further provides methods and apparatus of varying scope.

BRIEF DESCRIPTION OF THE DRAWINGS

FIG. 2A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, mechanical or electrical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

As the invention relates to selection of redundant elements in a memory device, the following description is set forth in two sections. The first section, with reference to FIGS. 1–4, describes a memory device and redundancy structure suited for use with the invention. A more detailed description of such memory devices may be found in U.S. application Ser. No. 09/642,341 filed Aug. 21, 2000 and titled, "Multiple Bit Line Column Redundancy," which is commonly assigned. The second section describes circuitry associated with the selection of redundant elements and their operation, including the introduction of test signals into the selection path during a test mode, with specific reference to such memory devices described with reference to FIGS. 1–4. However, the invention is not limited to such memory devices.

Memory Device and Redundancy Structure

Figure 1:
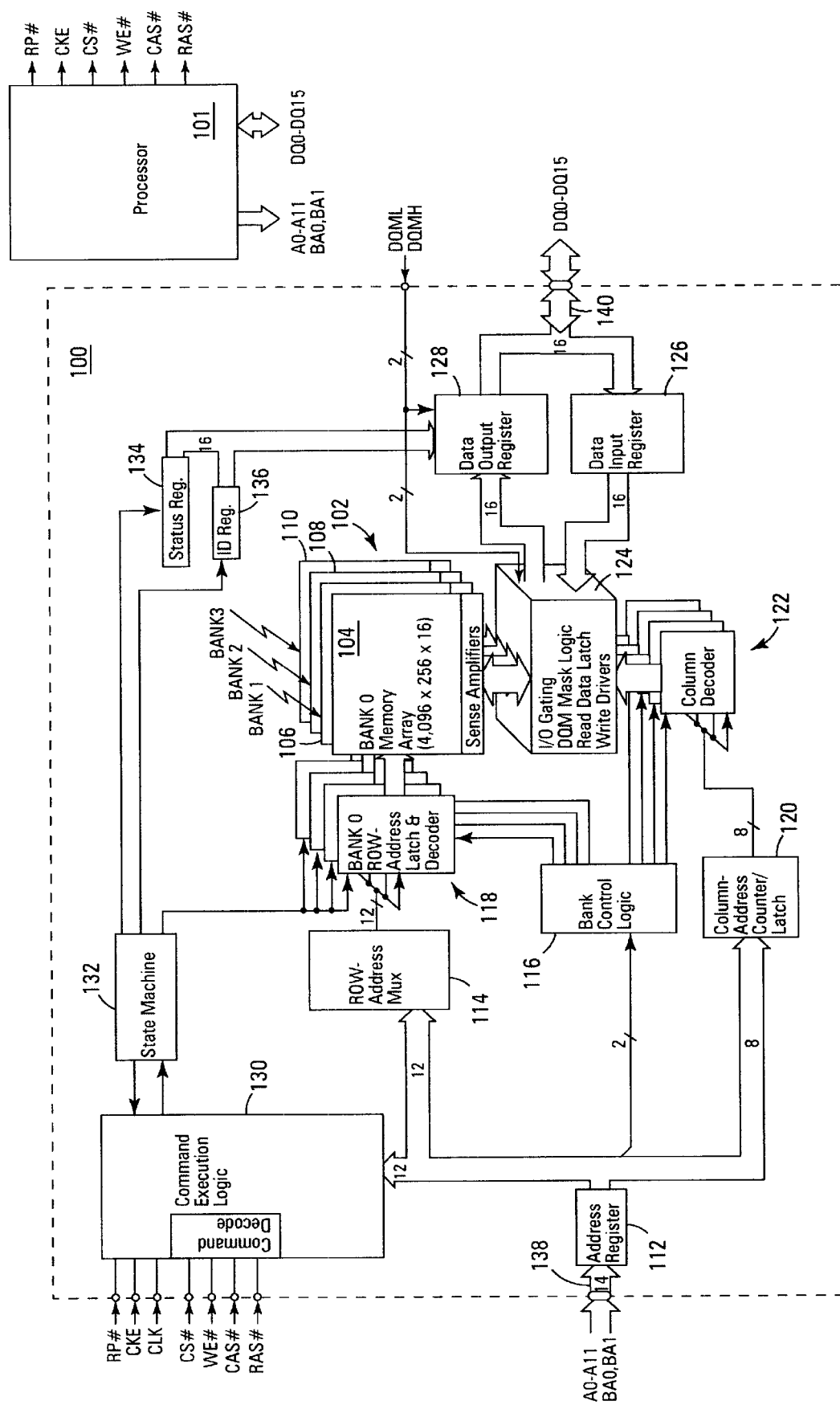
FIG. 1 is a block diagram of a memory device in accordance with the invention.

FIG. 1 is a block diagram of one embodiment of a synchronous memory device in accordance with the invention. The memory device 100 includes at least one redundancy match signal latch circuit (not shown in FIG. 1) as described herein. The memory device 100 includes an array of non-volatile flash memory cells 102. All access commands to the array 102 of the memory device 100 are synchronized to a system clock input signal (CLK), thus the memory device 100 may be referred to as a synchronous flash memory device or synchronous non-volatile memory device. However, the invention is not limited to synchronous or non-volatile memory devices, nor is it limited to memory devices having a specific redundancy structure as described herein.

The array 102 is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. The row address multiplexer circuitry 114, the bank control logic 116, the row address latch and decode circuitry 118, the column address counter and latch circuitry 120 and the column decode circuitry 122 can collectively be referred to as addressing circuitry. An address applied to the memory device 100, and thus the memory array 102, is decoded and directed to a target memory cell through such circuits to address, and thus access, the target memory cell. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 1 may be fabricated on a substrate, such as a semiconductor wafer, and may be referred to as a memory chip.

FIG. 2A illustrates an interconnect pin assignment of one embodiment of the present invention as a memory assembly having a pin layout substantially similar to an industry-standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to their respective portions of the interconnect pins of the memory package 150 in a conventional manner. Two interconnects shown in the embodiment of FIG. 2A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned.

Figure 2B:
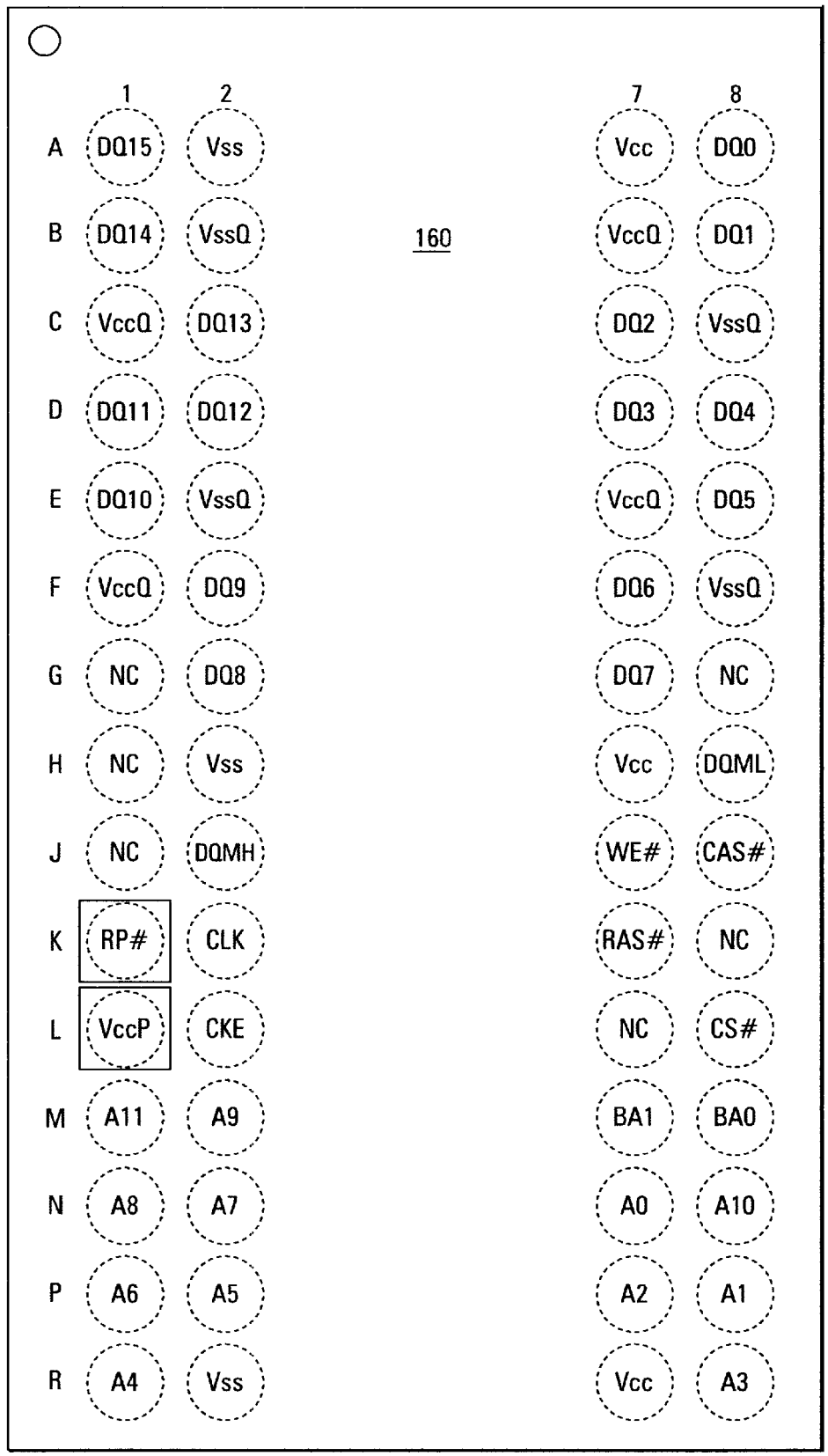
FIG. 2B is a top view of a memory assembly showing a package bump assignment diagram in accordance with the invention.

FIG. 2B illustrates a bump assignment of one embodiment of the present invention as a memory assembly having a bump layout substantially similar to an industry-standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing arrays having an organization with column redundancy in accordance with the various embodiments of the invention.

Figure 3:
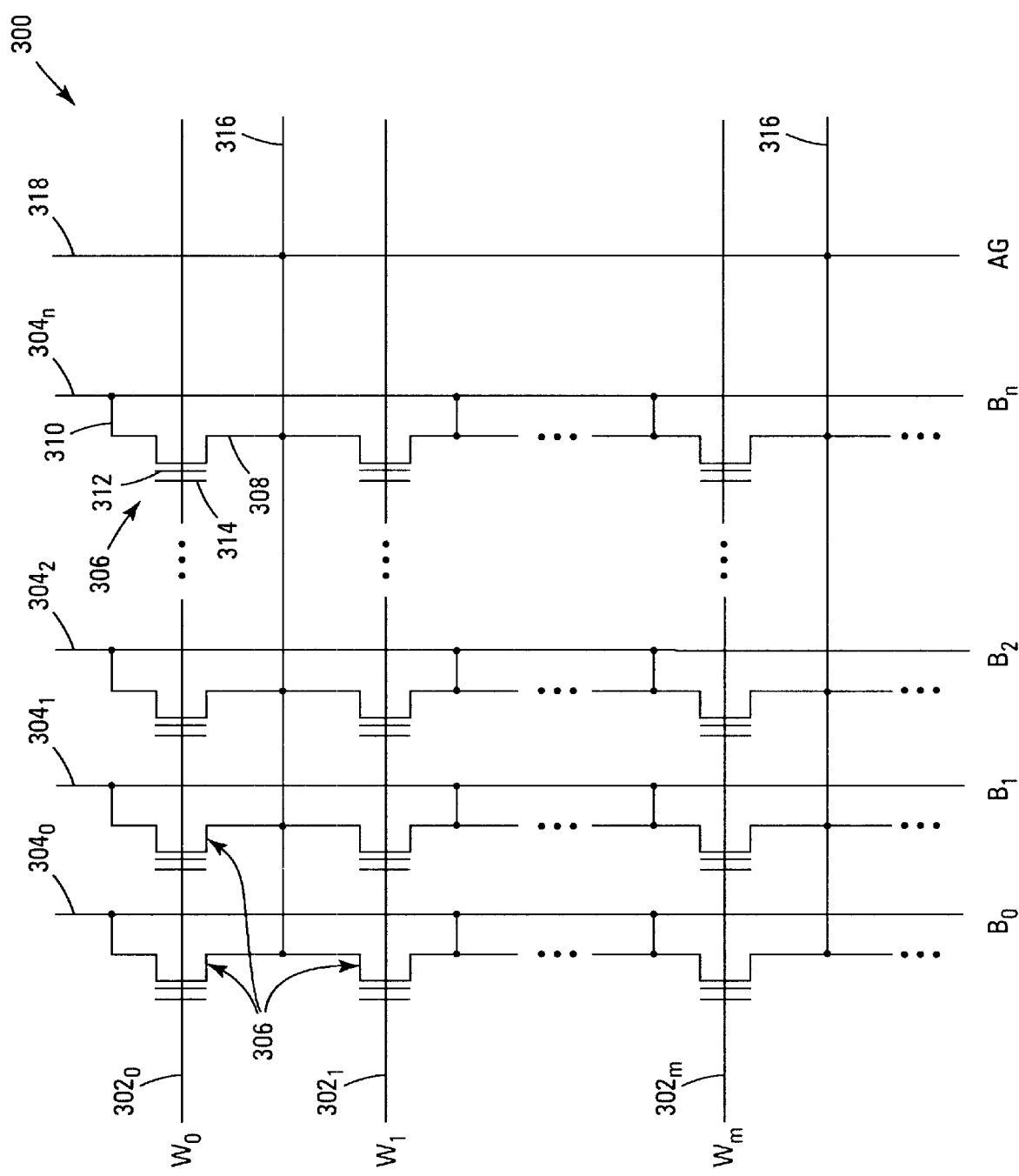
FIG. 3 is a schematic of a portion of a memory block in accordance with one embodiment of the invention.

Arrays of non-volatile memory cells are often configured as floating gate transistors placed at the intersection of word lines and bit lines. The word lines are coupled to the control gates of the floating gate transistors. FIG. 3 is a schematic of a portion of a non-volatile memory block 300 as a portion of a memory array 102 in accordance with one embodiment of the invention.

The detail of memory block 300 is provided to better understand the various embodiments of the invention. However, the invention is not limited to the specific floating-gate memory cell and layout described with reference to FIG. 3.

As shown in FIG. 3, the memory block 300 includes word lines 302 and intersecting local bit lines 304. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown in FIG. 3) in a many-to-one relationship.

Floating gate transistors 306 are located at each intersection of a word line 302 and a local bit line 304. The floating gate transistors 306 represent the non-volatile memory cells for storage of data. Typical construction of such floating gate transistors 306 include a source 308 and a drain 310 constructed from an $N^+$-type material of high impurity concentration formed in a P-type semiconductor substrate of low impurity concentration, a channel region formed between the source 308 and drain 310, a floating gate 312, and a control gate 314. Floating gate 312 is isolated from the channel region by a tunneling dielectric and from the control gate 314 by an intergate dielectric. The materials of construction are not critical to the invention, but commonly include doped polysilicon for the gate materials, and silicon oxides, nitrides or oxynitrides for the dielectric materials. Floating gate transistors 306 having their control gates 314 coupled to a word line 302 typically share a common source 308 depicted as array source 316. As shown in FIG. 3, floating gate transistors 306 coupled to two adjacent word lines 302 may share the same array source 316. Floating gate transistors 306 have their drains 310 coupled to a local bit line 304. A column of the floating gate transistors 306 are those transistors commonly coupled to a given local bit line 304. A row of the floating gate transistors 306 are those transistors commonly coupled to a given word line 302.

To reduce problems associated with high resistance levels in the array source 316, the array source 316 is regularly coupled to a metal or other highly conductive line to provide a low-resistance path to ground. The array ground 318 serves as this low-resistance path.

Figure 4A:
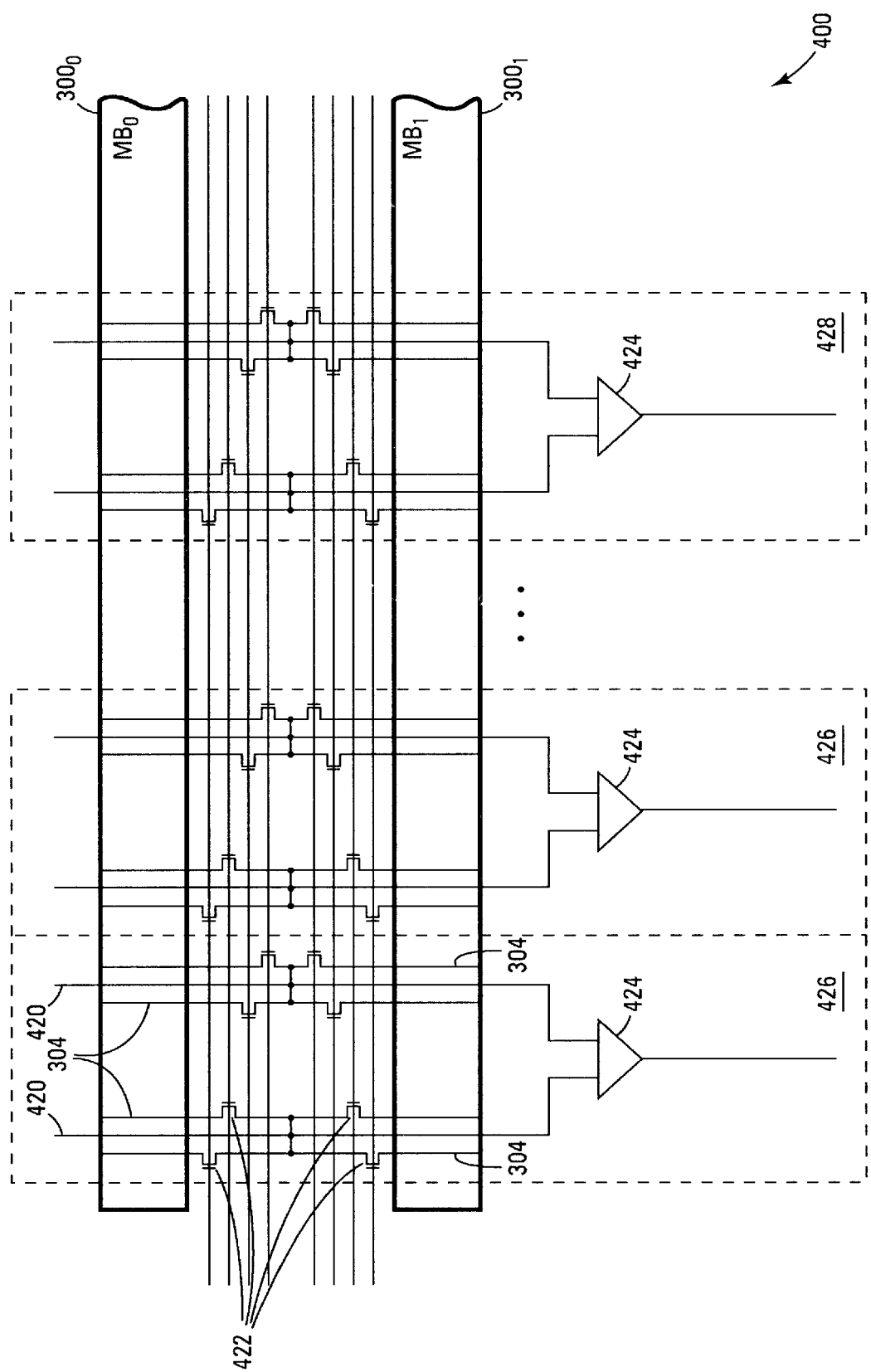
FIG. 4A is a schematic of a portion of a memory sector in accordance with one embodiment of the invention.
Figure 4B:
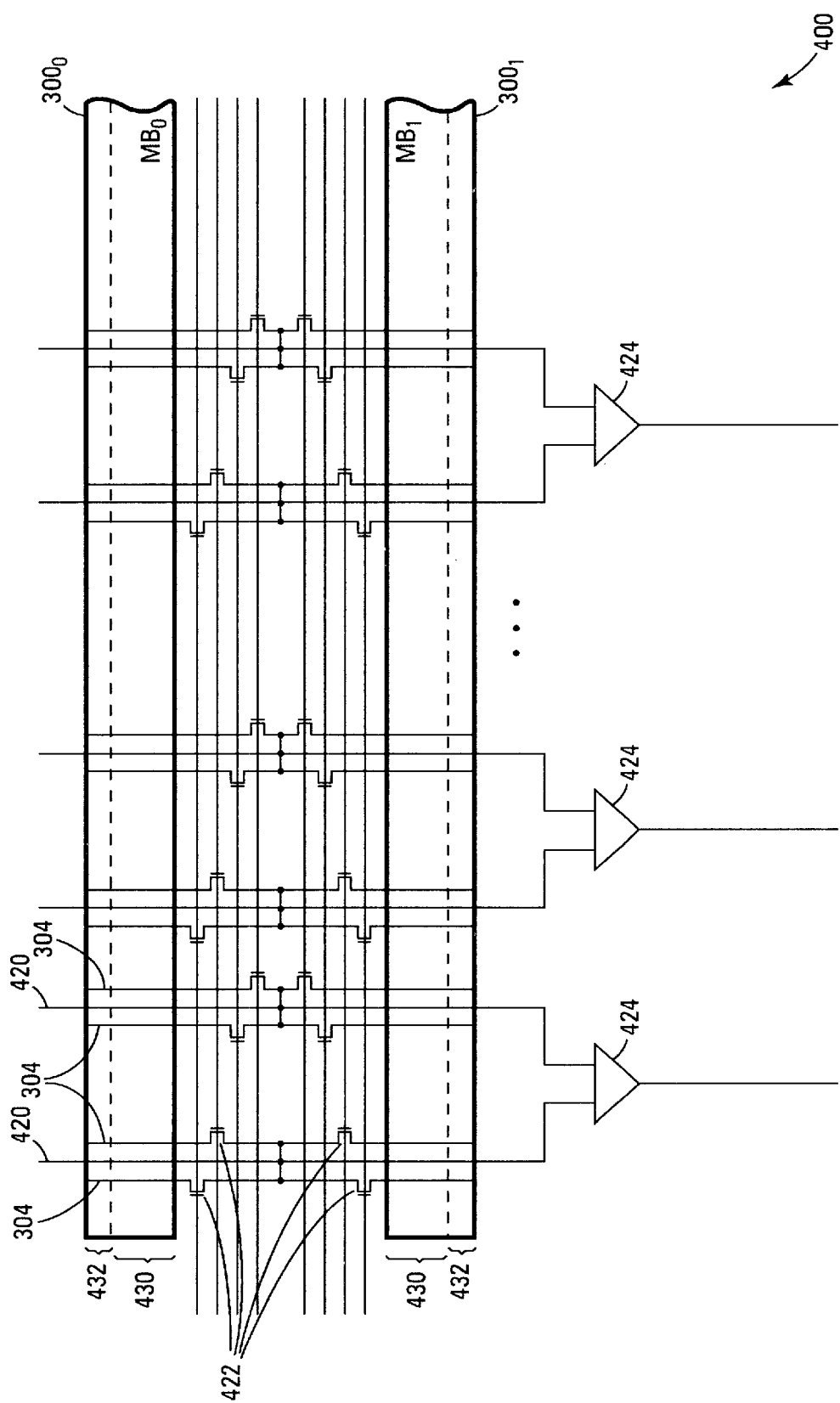
FIG. 4B is a schematic of a portion of a memory sector in accordance with another embodiment of the invention.

FIGS. 4A–4B are schematics of a portion of a memory sector 400 in accordance with various embodiments of the invention. In FIGS. 4A–4B, certain detail and reference numbers are omitted in the interest of clarity. The omitted detail is apparent from the context of use with reference to FIG. 3.

The portion of a memory sector 400 as depicted in each of FIGS. 4A–4B shows the coupling of local bit lines 304 of a memory block 300 to global bit lines 420 of the memory sector 400. The memory sector 400 includes at least one and preferably two or more memory blocks 300. For ease of addressing, the number of memory blocks 300 included in a memory sector 400 is generally some power of two, and each memory block 300 preferably has the same number of rows and columns. In the embodiments of FIGS. 4A–4B, memory sector 400 includes two memory blocks $300_0$ and $300_1$ identified as main blocks MB0 and MB1, respectively. Each memory block 300 has a row and column organization as generally described with reference to FIG. 3. In the interest of clarity, individual memory cells are not shown in FIGS. 4A–4B. To couple an individual memory cell to a sense amplifier 424, its associated word line is activated, thus activating the target memory cell as well as other memory cells associated with the word line. Note that to simplify access circuitry, word lines may be simultaneously activated in more than one memory block 300. The local bit line 304 associated, with the target memory cell is then actively coupled to an associated global bit line 420 such as by activating its block pass transistor 422, such that all other local bit lines 304 associated with the global bit line 420 and not used as reference bit lines are electrically isolated from the global bit line 420 with deactivated block pass transistors 422.

Block pass transistors 422 are activated in response to control signals from the row and column decoder circuits indicative of the target memory cell. Note that multiple local bit lines 304 may be simultaneously actively coupled to multiple associated global bit lines 420 in a one-to-one relationship to read multiple data bits in the same read operation. Memory cells whose word lines are deactivated or memory cells associated with local bit lines 304 not actively coupled to a global bit line 420 are ignored, i.e., such memory cells are electrically isolated from a sensing device.

As shown in FIGS. 4A–4B four local bit lines 304, two from each block 300, are coupled to each global bit line 420 through selective coupling devices, such as block pass transistors 422, with each global bit line 420 extending to two or more blocks 300. The local bit lines 304 are electrically isolated from each global bit line 420 until their associated selective coupling devices are activated. Global bit lines 420 are coupled in pairs to the sense amplifiers 424. Each pair of global bit lines 420 defines a first side, or sensing side, of the sense amplifier 424 and a second side, or reference side, of the sense amplifier 424. The sensing side of the sense amplifier is the side coupled to the target memory cell. Note that there are no intervening sensing devices between a local bit line 304 and its associated global bit line 420. Furthermore, the set of local bit lines 304 associated with one side of a sense amplifier 424 is mutually exclusive from the set of local bit lines 304 associated with the other side of the sense amplifier 424.

For the embodiments depicted in FIGS. 4A–4B, there is one sense amplifier 424 located in the span of every four local bit lines 304. By coupling each sense amplifier 424 to more than two local bit lines 304, the memory block 300 can make use of tighter packing of memory cells and local bit lines 304. To couple each sense amplifier 424 to only two local bit lines 304, the spacing of the local bit lines 304 may need to increase, the dimensions of the sense amplifiers 424 may need to decrease, or the sense amplifiers 424 may need to be staggered on each end of the memory sector 400; each case, however, would generally lead to a detrimental increase in die size or a detrimental reduction in signal drive by the sense amplifiers 424.

While two memory blocks 300 are depicted in FIGS. 4A–4B, additional memory blocks 300 could be coupled to the global bit lines 420 by extending the global bit lines 420 to the additional memory blocks 300. Note that there is no requirement that the global bit lines 420 extend across the memory block 300 farthest from the sense amplifiers (memory block $300_0$ in the embodiments of FIGS. 4A–4B); a global bit line 420 need only extend to a point of coupling to the block pass transistors 422 used to couple the global bit line 420 to its associated local bit lines 304.

During a read or sensing operation, a first local bit line 304 coupled to the target memory cell is actively coupled to its associated global bit line 420 through its block pass transistor 422 on the sensing side of a sense amplifier 424. To balance capacitance on each side of the sense amplifier 424 during a sensing operation, a second local bit line 304 is concurrently actively coupled to its associated global bit line 420 through its block pass transistor 422 on the reference side of the sense amplifier 424. The second local bit line 304 is electrically floating such that no memory cells are actively coupled to the second local bit line 304. Balancing the capacitance on each side of the sense amplifier 424 is preferred to improve the reliability of the sensing operation. For one embodiment, the first local bit line 304 is in a first memory block, such as main block MB0, while the second local bit line 304 is in a second memory block, such as main block MB1. For another embodiment, the first local bit line 304 and the second local bit line 304 are in the same memory block. For further embodiments, additional floating local bit lines are coupled, in balanced pairs, to the sensing and reference sides of the sense amplifier 424 during a sensing operation.

In the architectures thus described, a defect associated with one local bit line 304 will generally affect more than its associated column of memory cells. As an example, a defect associated with a local bit line 304 will risk erroneous data sensing whether the defective local bit line 304 is associated with the target memory cell or whether the defective local bit line 304 is used to balance capacitance on the reference side of a sense amplifier 424. It is known in the art that a defective primary grouping of memory cells can be replaced with redundant grouping of memory cells. For example, a column of memory cells containing a defect may be replaced by a redundant column of memory cells. While such replacement is feasible, such replacement may not be desirable in architectures of the type described with reference to FIGS. 4A–4B, where multiple local bit lines 304 are associated with each side of a sense amplifier 424.

For one embodiment, column redundancy is effected by providing a redundant sense amplifier 424, and associated global bit lines 420, local bit lines 304 and columns of memory cells. For this embodiment, as depicted in FIG. 4A, a defect associated with one primary grouping of memory cells 426 can be repaired by redirecting addressing for the defective primary grouping of memory cells 426 to a redundant grouping of memory cells 428. Thus, any access request, such as a read or write request, to a memory cell in the defective primary grouping of memory cells 426 is redirected to a memory cell in the redundant grouping of memory cells 428, regardless of whether the memory cell in the defective primary grouping of memory cells 426 is itself defective or is itself coupled to a local bit line 304 associated with a defect. Each grouping of memory cells 426, 428 contains a sense amplifier 424 and a pair of global bit lines 420, along with their associated local bit lines 304 and coupled memory cells. For one embodiment, there is one redundant grouping of memory cells 428 for every 256 primary groupings of memory cells 426. While increasing the ratio of redundant groupings of memory cells 428 to the primary groupings of memory cells 426 increases the likelihood of repairing every defective column of memory cells within the memory device, it also detrimentally increases the die real estate. Accordingly, this ratio should be balanced against the likelihood of defects and the costs of increased die size.

For another embodiment, row redundancy is effected by providing one or more redundant rows of memory cells in each memory block. For this embodiment, as depicted in FIG. 4B, a defect associated with one primary grouping of memory cells 430 can be repaired by redirecting addressing for the defective primary grouping of memory cells 430 to a redundant grouping of memory cells 432. Thus, any access request, such as a read or write request, to a memory cell in the defective primary grouping of memory cells 430 is redirected to a memory cell in the redundant grouping of memory cells 432, regardless of whether the memory cell in the defective primary grouping of memory cells 430 is itself defective. Each grouping of memory cells 430, 432 contains one or more rows of memory cells. For one embodiment, there is one redundant grouping of memory cells 430 for every 256 primary groupings of memory cells 432. While increasing the ratio of redundant groupings of memory cells 430 to the primary groupings of memory cells 432 increases the likelihood of repairing every defective row of memory cells within the memory device, it also detrimentally increases the die real estate. Accordingly, this ratio should be balanced against the likelihood of defects and the costs of increased die size.

Redundancy Selection Circuit

In general, redundancy selection involves comparing an applied memory cell location address with a known defective address; generating a match signal indicative of whether the applied address matches the known defective address; deactivating, suppressing or otherwise ignoring access circuitry for the primary element associated with the known defective address; and activating or otherwise accessing a redundant element designated to replace the primary element associated with the known defective address. The known defective address is identified during testing of the memory device and is generally programmed into a mapping circuit, such as a fuse-type circuit or other non-volatile storage device. In a fuse-type circuit, a blown fuse can represent a first binary value, such as logic 1, and an un-blown fuse can represent a second binary value, such as logic 0. Comparison of the applied address is generally carried out bit-by-bit with the binary values of the fuses. If all the corresponding bits of the applied address match the binary values of the fuses, a match is detected and the primary element is replaced by the redundant element associated with the mapping circuit. Generation of such a redundancy match signal is well understood in the art of memory devices. The address decoding is typically carried on in parallel to generation of the match signal such that the decoded address and the match signal are available at substantially the same time.

Figure 5:
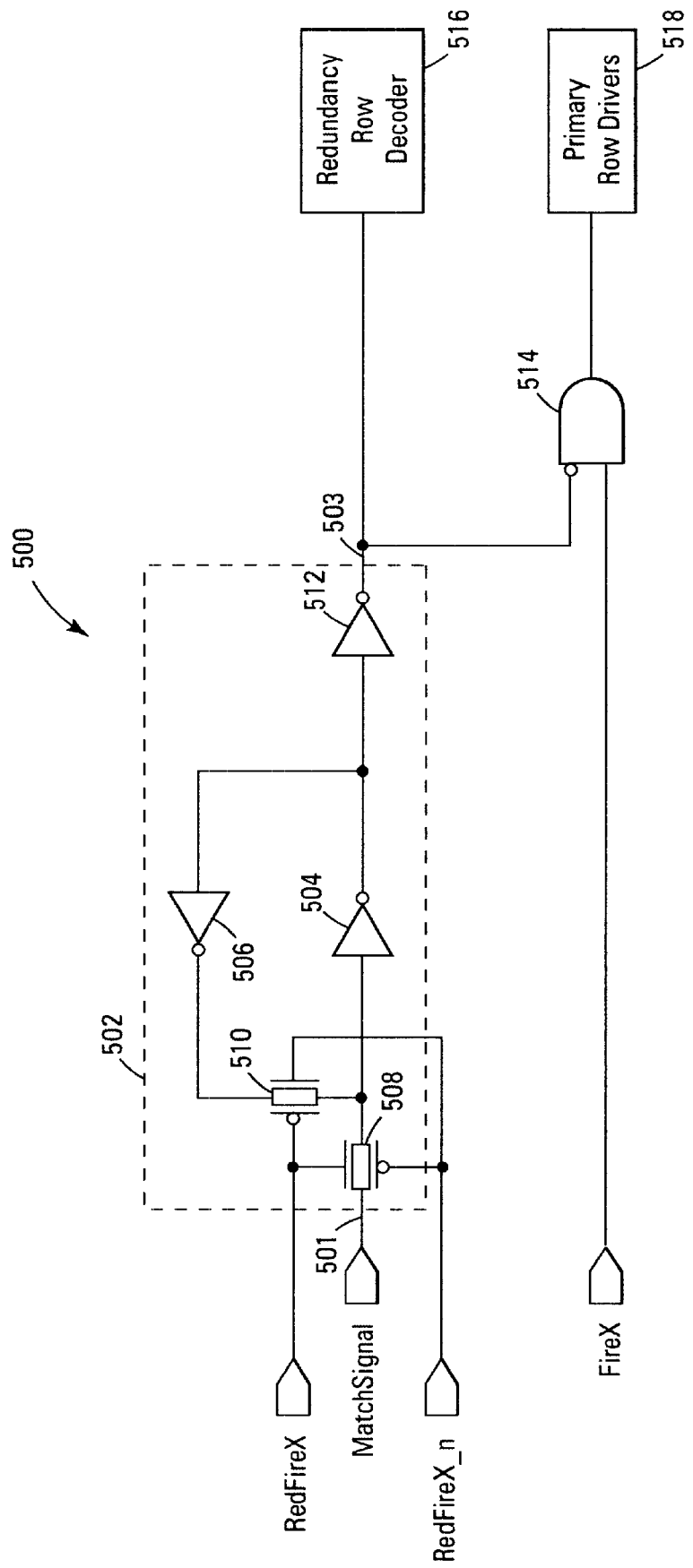
FIG. 5 is a schematic of a redundancy selection circuit for selectively activating or suppressing a redundant and primary element.

The match signal having a first logic level can be used to activate a redundant element, such as a redundant row, column or other grouping of memory cells, and to suppress activation of a primary element. The match signal having a second logic level can be used to activate the primary element and to suppress activation of the redundant element. FIG. 5 is a schematic of a redundancy selection circuit 500 for alternatively activating or suppressing a redundant and primary element. For the example depicted in FIG. 5, the redundant and primary elements are rows of memory cells. The redundancy selection circuit 500 may be a portion of the addressing circuitry of the memory device 100.

The match signal is provided to the redundancy match signal latch 502 on the latch input 501. The match signal is typically generated in response to a clock edge and is thus transitory in nature. The match signal is latched to avoid loss of the information on the next transition of the clock. Application of the match signal to the redundancy match signal latch 502 may be gated through a selective coupling device such as the pass gate 508. The pass gate 508 is depicted as a parallel-coupled n-channel and p-channel field effect transistor (FET), but could include any selective coupling device for selectively providing electrical communication or electrical isolation in response to a control signal. Although the pass gate 508 is responsive to a first control signal applied to the gate of the nFET, RedFireX, and a second control signal applied to the gate of the pFET, RedFireX_n, the two control signals can be deemed to act as a single control signal as the two control signals are complementary.

The latch 502 generally includes a pair of reverse-coupled inverters including a feedforward inverter 504 and a feedback inverter 506. The inverters 504 and 506 could include additional logic provided the match signal, in normal operation, is inverted first by the feedforward inverter 504 and the inverted match signal from the output of the feedforward inverter 504 is then inverted again by the feedback inverter 506. The feedback inverter 506 is generally a weak inverter to allow faster transition times. To facilitate latching the match signal in the latch 502, an additional pass gate 510 may be inserted in the feedback portion of the latch so the match signal does not have to overcome the output of the feedback inverter 506 in setting the latch 502. The pass gate 510 is interposed between the output of the feedback inverter 506 and the input of the feedforward inverter 504, having an input coupled to the output of the feedback inverter 506 and an output coupled to the input of the feedforward inverter 504. The pass gate 508 has an input coupled to receive the match signal and an output coupled to the output of the pass gate 510.

The signal on the output 503 of the latch circuit 502, i.e., the latched match signal, is then used to control suppression and activation of the primary and redundant elements. The latched match signal is derived from the feedforward signal. Note that the feedforward signal is inverted from the incoming match signal or the feedback signal. Although the latched match signal can be derived from the feedforward signal without alteration, the latched match signal can be made to have the same logic level as the feedback signal by inserting an optional inverter 512 between the output of the feedforward inverter 504 and the output of the latch circuit 502. A latched match signal having a first logic level, such as a logic 1, is indicative of a match between the location address and a known defective element. Thus, a latched match signal having the first logic level is indicative of a desire to activate the redundant row decoder 516 and to suppress activation of the primary row drivers 518. Activation of the redundant row decoder 516 results in activation of a redundant row driver (not shown in FIG. 5) for accessing a redundant row of memory cells (not shown in FIG. 5). The redundant row decoder 516 represents a redundant element access device for accessing a redundant element. Similarly, a latched match signal having a second logic level, such as a logic 0, is indicative of no match between the location address and a known defective element. Thus, a latched match signal having the second logic level is indicative of a desire to activate the primary row drivers 518 and to suppress activation of the redundant row decoder 516. Activation of the primary row drivers 518 results in activation of a primary row of memory cells (not shown in FIG. 5). The primary row drivers 518 represent a primary element access device for accessing a primary element.

The primary row drivers 518 are activated in response to a control signal, FireX, when there is a desire to suppress activation of the redundant element and to activate the primary element. As shown in FIG. 5, this can be accomplished for this embodiment by providing the latched match signal to an inverted first input of the AND gate 514 and providing the control signal FireX to a second input of the AND gate 514. When the latched match signal has a logic level of logic 1, the output of the AND gate 514 is forced to a logic level of logic 0 regardless of the logic level of the control signal FireX, thus suppressing activation of the primary row drivers 518 and access to the primary elements. Similarly, when the latched match signal has a logic level of logic 0, the output of the AND gate 514 is determined by the logic level of the control signal FireX, thus allowing the control signal FireX to activate the primary row drivers 518 and access the primary elements. Other logic circuits can be used to selectively access the primary element in response to the FireX control signal when the latched match signal has a logic level indicative of a desire to suppress access to the redundant element, and to suppress access to the primary element regardless of the logic level of the FireX control signal when the latched match signal has a logic level indicative of a desire to access the redundant element.

Figure 6A:
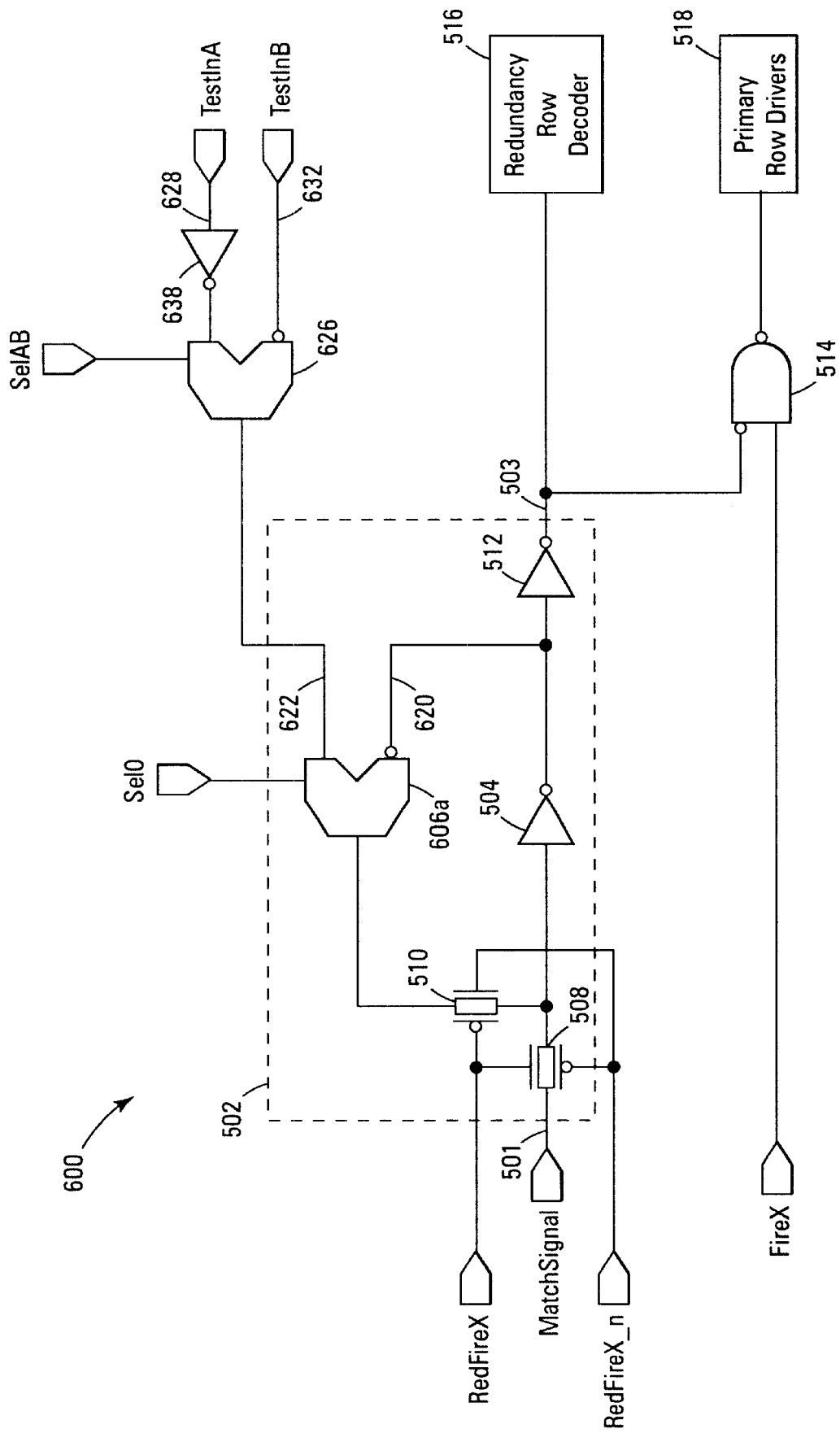
FIG. 6A is a schematic of a redundancy selection circuit providing for the introduction of test input signals to the redundancy selection path in accordance with one embodiment of the invention.

During testing of a memory device, it may be desirable to activate redundant memory elements prior to or without programming the match circuit. Additional logic generally must be inserted in the redundancy selection path to accomplish such activation. As this logic in only necessary during testing, it preferably has minimal impact on the redundancy selection path during normal operation of the memory device. FIGS. 6A–CC are schematics of redundancy selection circuits 600 providing for the introduction of test input signals to the redundancy selection path in accordance with embodiments of the invention.

In FIG. 6A, the feedback inverter 506 is replaced by a 2:1 multiplexer 606a. The multiplexer 606a, as the feedback inverter, has an inverted first input 620 for receiving and inverting the output signal of the feedforward inverter 504 as a feedback signal. The first input 620 may be inverted internal to the multiplexer 606a, prior to the multiplexer 606a or subsequent to the multiplexer 606a. The multiplexer 606a further has a second input 622 for receiving a test input signal. The second input 622 need not be inverted.

The output signal of the multiplexer 606a is selected from the input signals in response to the control signal Sel0. During normal operation, the control signal Sel0 is set to permit passing of the feedforward signal to the output of the multiplexer 606a and to inhibit passing of the test input signal, thus causing the pair of reverse-coupled inverters to generate the latched match signal from the match signal applied to the input 501 of the latch 502. During a given test mode, the control signal Sel0 may be set to permit passing of the test input signal to the output of the multiplexer 606a and to inhibit passing of the feedforward signal, thus causing the pair of reverse-coupled inverters to generate the latched match signal from one of the test input signals applied to the multiplexer 606a. In this manner, the latched match signal can be set to a desired logic level during testing independent of the logic level of the match signal applied to the input 501 of the latch 502. Furthermore, during normal operation, the latched match signal will have a logic level independent of the logic level of any test input signal applied to the multiplexer 606a.

The redundancy selection circuit 600 of FIG. 6A further shows that the test input signal to the multiplexer 606a may be selected from two or more test input signals using an additional multiplexer 626. Multiplexer 626 selects from test input signals TestInA and TestInB in response to control signal SelAB to introduce the desired test input signal into the latch 502 of the redundancy selection circuit 600. Note that both test inputs 628 and 632 may be inverted inputs. Test input 628 of multiplexer 626 is inverted at a location prior to the multiplexer 626 using inverter 638. Test input 632 of multiplexer 626 is inverted at a location internal to the multiplexer 626. All inputs of a multiplexer could be inverted inputs by inverting the output of the multiplexer, such as by placing an inverter at a location subsequent to the multiplexer.

Figure 6B:
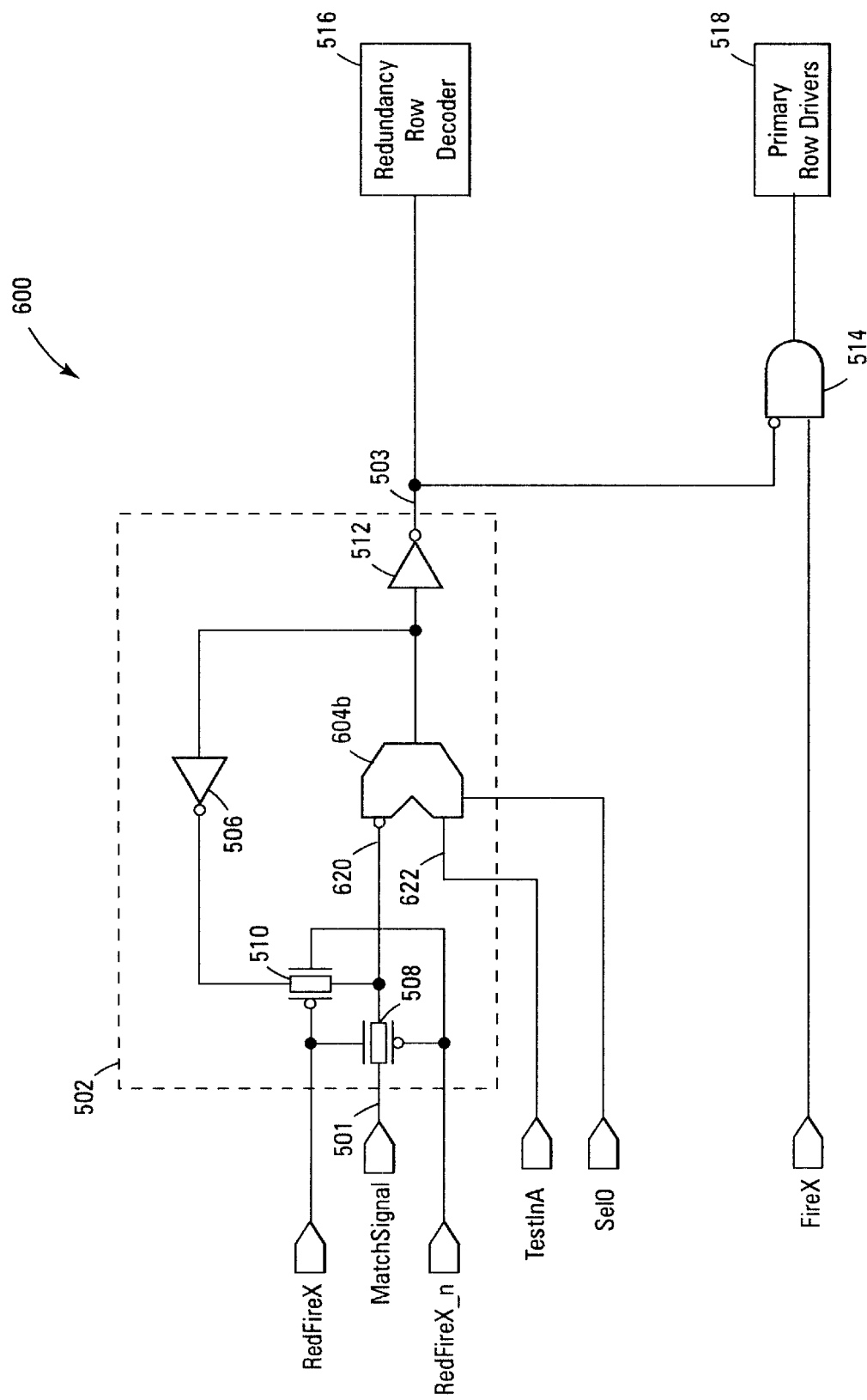
FIG. 6B is a schematic of a redundancy selection circuit providing for the introduction of test input signals to the redundancy selection path in accordance with another embodiment of the invention.

The redundancy selection circuit of FIG. 6B demonstrates that either inverter of the reverse-coupled inverter pair may be a multiplexer having an inverted input. In FIG. 6B, the feedforward inverter 504 is replaced by a 2:1 multiplexer 604b. The multiplexer 604b, as the feedforward inverter, has an inverted first input 620 for receiving and inverting either the output signal of the feedback inverter 506 or the redundancy match signal as a feedforward signal. The first input 620 may be inverted internal to the multiplexer 604b, prior to the multiplexer 604b or subsequent to the multiplexer 604b. The multiplexer 604b further has a second input 622 for receiving a test input signal. The second input 622 need not be inverted.

The output signal of the multiplexer 604b is selected from the input signals in response to the control signal Sel0. During normal operation, the control signal Sel0 is set to permit passing of the feedback signal (or the redundancy match signal) to the output of the multiplexer 604b and to inhibit passing of the test input signal. During testing, the control signal Sel0 may be set to permit passing of the test input signal to the output of the multiplexer 604b and to inhibit passing of the feedback signal (or the redundancy match signal). In this manner, the output of the latch 502 can be set to a desired logic level during testing regardless of the logic level of the match signal.

Figure 6C:
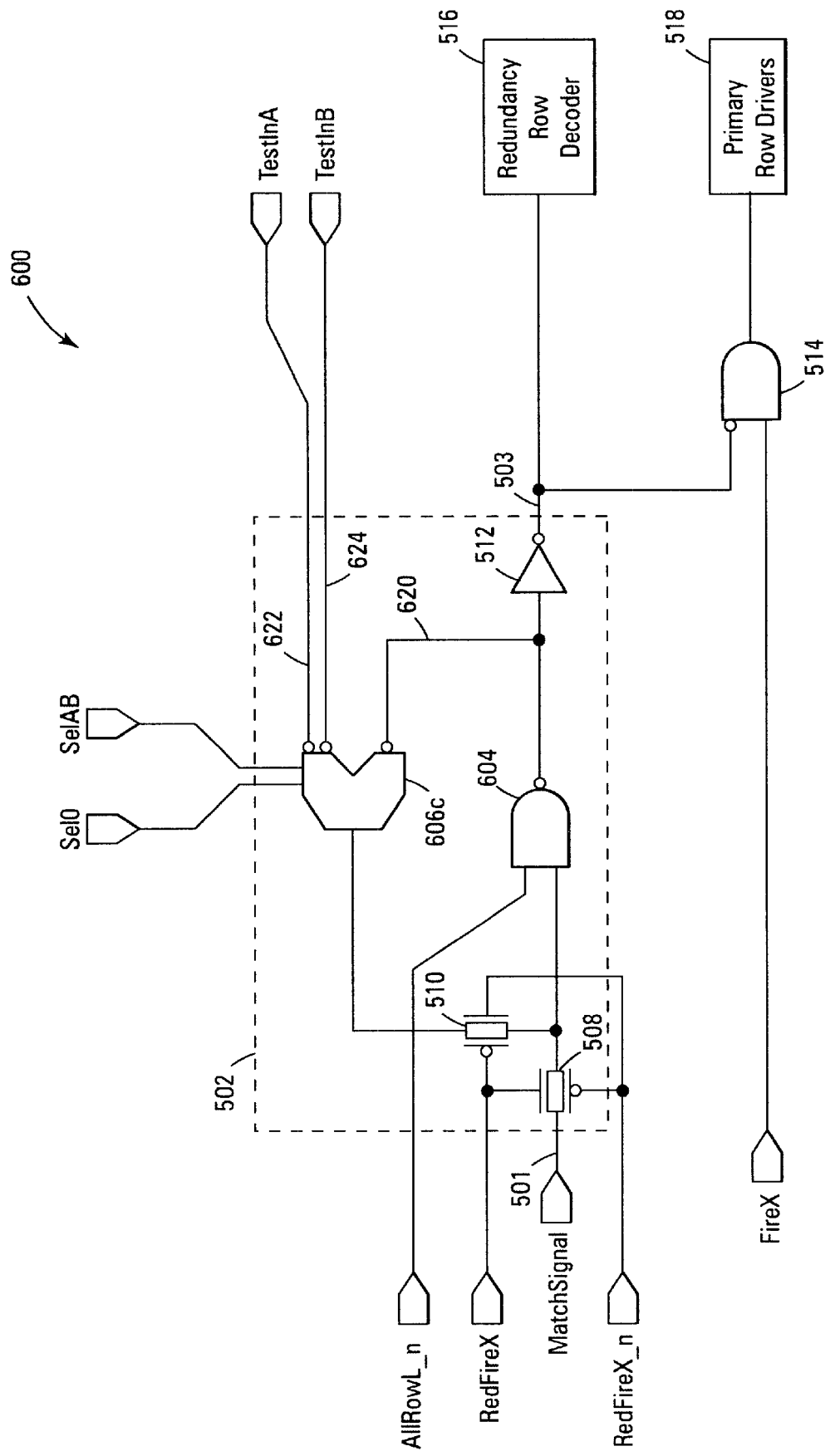
FIG. 6C is a schematic of a redundancy selection circuit providing for the introduction of test input signals to the redundancy selection path in accordance with a further embodiment of the invention.

The redundancy selection circuit 600 of FIG. 6C demonstrates how an inverter can contain other logic. As shown, the redundancy selection circuit 600 of FIG. 6B has a NAND gate 604 as the feedforward inverter. Use of the control signal AllRowL__n permits forcing the latched match signal to a logic level of logic 1 by setting the control signal AllRowL__n to a logic level of logic 0, regardless of the logic level of the remaining input signal to the NAND gate 604. However, use of the control signal AllRowL__n does not permit forcing the latched match signal to a logic level of logic 0 as the output of the NAND gate 604 is not independent of the logic level applied to its remaining input; by setting the control signal AllRowL__n to a logic 1, the output signal of the NAND gate 604 is determined by the logic level of the remaining input signal to the NAND gate 604. Other logic circuits having two or more inputs can function as inverters provided that the input coupled to receive the output signal from the remaining inverter is capable of providing an inverted signal on the output of the logic circuit, and that input is capable of determining the logic level on the output of the logic circuit given some combination of remaining input signals.

The feedback inverter of the redundancy selection circuit 600 of FIG. 6C is a 3:1 multiplexer 606c. The multiplexer 606c has an inverted first input 620 coupled to the output of the NAND gate 604. The multiplexer 606c further has an inverted second input 622 coupled to receive a first test input signal TestInA and an inverted third input 624 coupled to receive a second test input signal TestInB. The multiplexer 606c selectively couples its output to either the first input 620, the second input 622 or the third input 624 in response to two control signals Sel0 and SelAB. Although the multiplexer 606c is depicted as a 3:1 multiplexer, the multiplexer can be any n:1 multiplexer, where n is some integer greater than or equal to 2. Such n:1 multiplexers selectively couple their output to one input from n inputs in response to one or more control signals. Higher-order multiplexers may be constructed as multiple series-connected multiplexers, e.g., the two 2:1 multiplexers of FIG. 6A acting together as a 3:1 multiplexer responsive to two control signals.

Figure 7:
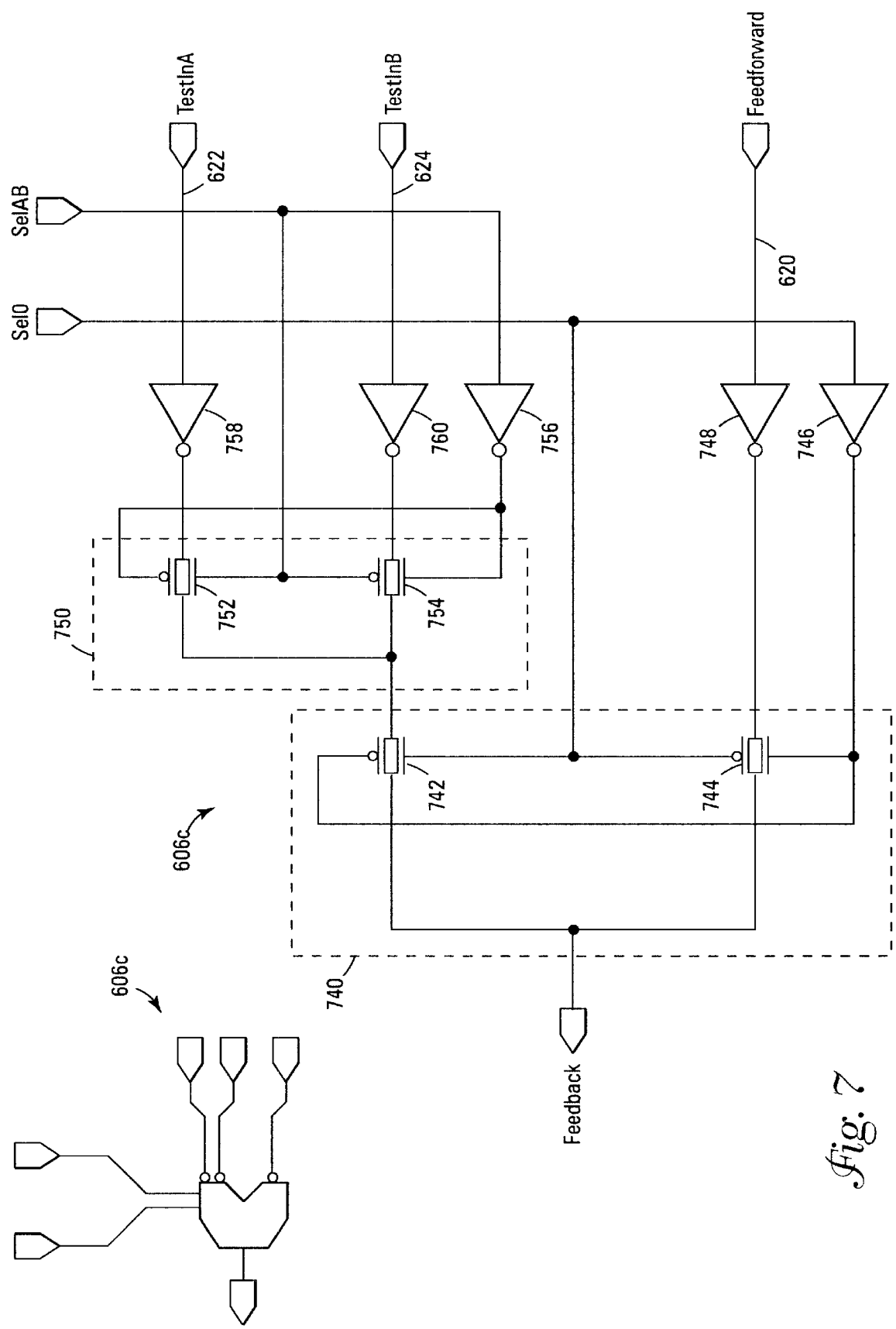
FIG. 7 is a schematic of a multiplexer as used in FIG. 6C.

FIG. 7 is a schematic of one embodiment of a multiplexer 606c in accordance with the invention as used in FIG. 6C. The multiplexer 606c includes a first multiplexer stage 740 having a first pass gate 742 and a second pass gate 744. The multiplexer 606c further includes a second multiplexer stage 750 having a first pass gate 752 and a second pass gate 754. It can be seen that, for this embodiment, the first multiplexer stage 740 and the second multiplexer stage 750 are each a 2:1 multiplexer responsive to their respective control signals Sel0 and SelAB.

The first pass gate 742 of the first multiplexer stage 740 selectively passes or inhibits passing the output from the second multiplexer stage 750, i.e., the selected test input signal, as the feedback signal. The second pass gate 744 of the first multiplexer stage 740 selectively passes or inhibits passing the inverted feedforward signal as the feedback signal. The inverter 748 is provided to invert the first input 620 internal to the multiplexer 606c. The first pass gate 742 and the second pass gate 744 are responsive to the control signal Sel0. As depicted, the control signal Sel0 is concurrently applied to the gate of the nFET device of the first pass gate 742 and the gate of the pFET device of the second pass gate 744. The control signal Sel0 is inverted by the inverter 746 and applied to the gate of the pFET device of the first pass gate 742 and the gate of the nFET device of the second pass gate 744. In this manner, the first pass gate 742 is activated when the control signal Sel0 has a logic level of logic 1 and the second pass gate 744 is activated when the control signal Sel0 has a logic level of logic 0.

The first pass gate 752 of the second multiplexer stage 750 selectively passes or inhibits passing the first test input signal TestInA as the selected test input signal. The first test input signal TestInA may be inverted using inverter 758 internal to the multiplexer 606c. The second pass gate 754 of the second multiplexer stage 750 selectively passes or inhibits passing the second test input signal TestInB as the selected test input signal. The second test input signal TestInB may be inverted using inverter 760 internal to the multiplexer 606c. The first pass gate 752 and the second pass gate 754 are responsive to the control signal SelAB. As depicted, the control signal SelAB is concurrently applied to the gate of the nFET device of the first pass gate 752 and the gate of the pFET device of the second pass gate 754. The control signal SelAB is inverted by the inverter 756 and applied to the gate of the pFET device of the first pass gate 752 and the gate of the nFET device of the second pass gate 754. In this manner, the first pass gate 752 is activated when the control signal SelAB has a logic level of logic 1 and the second pass gate 754 is activated when the control signal SelAB has a logic level of logic 0.

As can be seen from the foregoing figures and description, test input signals can be introduced into the latch of a redundancy selection circuit using the various embodiments of the invention. Such embodiments permit introduction of the test input signals with only minimal impact to the redundancy selection path during normal operation of a memory device.

CONCLUSION

Memory devices having redundancy selection circuitry have been described, with particular reference to synchronous non-volatile memory devices. The memory devices include a redundancy selection circuit having a latch for latching an incoming redundancy match signal. The latch includes a pair of reverse-coupled inverters. The latch is further coupled to receive one or more test input signals. The latch is responsive to one or more control signals to selectively generate the latched match signal from the incoming redundancy match signal or one of the test input signals. When the latched match signal is generated from the incoming redundancy match signal, the logic level of the latched match signal is independent of the logic level of any of the test input signals. When the latched match signal is generated from one of the test input signals, the logic level of the latched match signal is independent of the logic level of the incoming redundancy match signal. Such latch circuits are useful for controlling selection of a redundant element in a memory device during testing without significantly impacting the speed path of the redundancy selection circuitry during normal operation of the memory device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For one example, both inverters of the reverse-coupled inverter pair could be replaced with multiplexers. Accordingly, this application is intended to cover any adaptations or variations of the invention. It is manifestly intended that this invention be limited only by the following claims and equivalents thereof.

What is claimed is:

1. A redundancy match signal latch circuit, comprising:
   a pair of reverse-coupled inverters having a first inverter and a second inverter, wherein the first inverter has at least one test input, each for receiving a test input signal;
   a latch input for providing a redundancy match signal to the pair of reverse-coupled inverters; and
   a latch output for providing a latched match signal from the pair of reverse-coupled inverters;
   wherein the first inverter is responsive to one or more control signals to cause the pair of reverse-coupled inverters to generate the latched match signal from either the redundancy match signal or a test input signal;
   wherein a logic level of the latched match signal is independent of a logic level of the redundancy match signal when the pair of reverse-coupled inverters generates the latched match signal from a test input signal; and
   wherein a logic level of the latched match signal is independent of a logic level of any test input signal when the pair of reverse-coupled inverters generates the latched match signal from the redundancy match signal.

2. The redundancy match signal latch of claim 1, wherein the first inverter is a multiplexer having an inverted first input coupled to receive an output signal of the second inverter.

3. The redundancy match signal latch of claim 1, wherein the first inverter is a multiplexer having an inverted first input coupled to selectively receive an output signal of the second inverter or the redundancy match signal.

4. The redundancy match signal latch of claim 3, wherein the second inverter is a multiplexer having an inverted first input coupled to receive an output signal of the first inverter.

5. A redundancy match signal latch circuit, comprising:
   a feedforward inverter having an input for receiving a first signal that is selectively either a redundancy match signal or a feedback signal, and an output for providing an inverted first signal as a feedforward signal; and
   a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs.

6. The redundancy match signal latch of claim 5, wherein the inverted first input of the multiplexer is inverted at a location internal to the multiplexer.

7. The redundancy match signal latch of claim 5, wherein the feedforward inverter is a NAND gate further having a second input for receiving a second signal, and wherein the output of the NAND gate provides the inverted first signal when the second signal has a logic level of logic 1.

8. The redundancy match signal latch of claim 5, wherein at least one of the at least one additional inputs is an inverted input.

9. A redundancy match signal latch circuit, comprising:
   a NAND gate having a first input for receiving a first signal, a second input for receiving a second signal that is selectively either a redundancy match signal or a feedback signal, and an output for providing a feedforward signal; and
   a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs.

10. A redundancy match signal latch circuit, comprising:
    a NAND gate having a first input for receiving a first signal, a second input for receiving a second signal that is selectively either a redundancy match signal or a feedback signal, and an output for providing a feedforward signal; and
    a multiplexer having an inverted first input, at least one additional inverted input, and an output for providing the feedback signal, wherein the inverted first input is coupled to receive the feedforward signal and each additional inverted input is coupled to receive a test input signal, further wherein the multiplexer is responsive to at least one control signal to selectively couple its output to either its first input or one of the at least one additional inverted inputs.

11. A redundancy match signal latch circuit, comprising:
    a NAND gate having a first input for receiving a first signal, a second input, and an output for providing a feedforward signal;
    a multiplexer having an inverted first input, at least one additional input, and an output for providing a feedback signal, wherein the inverted first input is coupled to receive the feedforward signal and each additional input is coupled to receive a test input signal, further wherein the multiplexer is responsive to at least one first control signal to selectively couple its output to either its the first input or one of the at least one additional inverted inputs;
    a first selective coupling device having an input coupled to the output of the multiplexer and an output coupled to the second input of the NAND gate; and
    a second selective coupling device having an input coupled to receive a redundancy match signal and an output coupled to the output of the first selective coupling device;
    wherein the first selective coupling device and the second selective coupling device are each responsive to a second control signal to couple the match signal to, and isolate the feedback signal from, the second input of the NAND gate when the second control signal has a first logic level; and
    wherein the first selective coupling device and the second selective coupling device are each responsive to the second control signal to couple the feedback signal to, and isolate the match signal from, the second input of the NAND gate when the second control signal has a second logic level.

12. A redundancy match signal latch circuit, comprising:
    a multiplexer having an inverted first input for receiving a first signal that is selectively either a redundancy match signal or a feedback signal, at least one additional input each for receiving a test input signal, and an output for providing a feedforward signal; and
    a feedback inverter having an input for receiving the feedforward signal and an output for providing the feedback signal as an inverted feedforward signal;
    wherein the multiplexer is responsive to at least one control signal to selectively couple its output to either its first input or one of the at least one additional inputs.

13. The redundancy match signal latch of claim 12, wherein the second input of the multiplexer is also an inverted input.

14. The redundancy match signal latch of claim 12, wherein the inverted first input of the multiplexer is inverted at a location internal to the multiplexer.

15. The redundancy match signal latch of claim 12, wherein the feedback inverter is a NAND gate further having a second input for receiving a second signal, and wherein the output of the NAND gate provides the inverted feedforward signal when the second signal has a logic level of logic 1.

16. A redundancy selection circuit, comprising:
a latch circuit having an input for receiving a redundancy match signal and an output for providing a latched match signal, the latch circuit comprising:
  a pair of reverse-coupled inverters having a first inverter and a second inverter, wherein the first inverter has at least one test input, each for receiving a test input signal;
  wherein the first inverter is responsive to one or more control signals to cause the pair of reverse-coupled inverters to generate the latched match signal from either the redundancy match signal or a test input signal;
  wherein a logic level of the latched match signal is independent of a logic level of the redundancy match signal when the pair of reverse-coupled inverters generates the latched match signal from a test input signal; and
  wherein a logic level of the latched match signal is independent of a logic level of any test input signal when the pair of reverse-coupled inverters generates the latched match signal from the redundancy match signal;
a redundant element access device, wherein the redundant element access device is responsive to the latched match signal to access a redundant element when the latched match signal has a first logic level and to suppress access to the redundant element when the latched match signal has a second logic level; and
a primary element access device, wherein the primary element access device is responsive to a second control signal to selectively access a primary element when the latched match signal has the second logic level and wherein access to the primary element by the primary element access device is suppressed regardless of a logic level of the second control signal when the latched match signal has the first logic level.

17. A redundancy selection circuit, comprising:
a latch circuit having an input for receiving a redundancy match signal and an output for providing a latched match signal, the latch circuit comprising:
  a feedforward inverter having an input for receiving a first signal that is selectively either the redundancy match signal or a feedback signal, and an output for providing an inverted first signal as a feedforward signal, wherein the latched match signal is derived from the feedforward signal; and
  a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;
a redundant element access device, wherein the redundant element access device is responsive to the latched match signal to access a redundant element when the latched match signal has a first logic level and to suppress access to the redundant element when the latched match signal has a second logic level; and
a primary element access device, wherein the primary element access device is responsive to a second control signal to selectively access a primary element when the latched match signal has the second logic level and wherein access to the primary element by the primary element access device is suppressed regardless of a logic level of the second control signal when the latched match signal has the first logic level.

18. A redundancy selection circuit, comprising:
a latch circuit having an input for receiving a redundancy match signal and an output for providing a latched match signal, the latch circuit comprising:
  a NAND gate having a first input for receiving a first signal, a second input for receiving a second signal that is selectively either the redundancy match signal or a feedback signal, and an output for providing a feedforward signal, wherein the latched match signal is derived from the feedforward signal; and
  a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;
a redundant element access device, wherein the redundant element access device is responsive to the latched match signal to access a redundant element when the latched match signal has a first logic level and to suppress access to the redundant element when the latched match signal has a second logic level; and
a primary element access device, wherein the primary element access device is responsive to a second control signal to selectively access a primary element when the latched match signal has the second logic level and wherein access to the primary element by the primary element access device is suppressed regardless of a logic level of the second control signal when the latched match signal has the first logic level.

19. A redundancy selection circuit, comprising:
a latch circuit having an input for receiving a redundancy match signal and an output for providing a latched match signal, the latch circuit comprising:
  a multiplexer having an inverted first input for receiving a first signal that is selectively either the redundancy match signal or a feedback signal, at least one additional input each for receiving a test input signal, and an output for providing a feedforward signal, wherein the latched match signal is derived from the feedforward signal; and
  a feedback inverter having an input for receiving the feedforward signal and an output for providing the feedback signal as an inverted feedforward signal;
  wherein the multiplexer is responsive to at least one control signal to selectively couple its output to either its first input or one of the at least one additional inputs;
a redundant element access device, wherein the redundant element access device is responsive to the latched match signal to access a redundant element when the latched match signal has a first logic level and to suppress access to the redundant element when the latched match signal has a second logic level; and a primary element access device, wherein the primary element access device is responsive to a second control signal to selectively access a primary element when the latched match signal has the second logic level and wherein access to the primary element by the primary element access device is suppressed regardless of a logic level of the second control signal when the latched match signal has the first logic level.

20. A memory device, comprising:

a memory array having at least one primary grouping of memory cells and at least one redundant grouping of memory cells; and addressing circuitry coupled to the memory array for accessing a target memory cell in response to a location address applied to the memory device, wherein the addressing circuitry selectively accesses either a primary grouping of memory cells or a redundant grouping of memory cells in response to a latched match signal from a latch circuit, the latch circuit comprising:

a pair of reverse-coupled inverters having a first inverter and a second inverter, wherein the first inverter has at least one test input, each for receiving a test input signal;

wherein the first inverter is responsive to one or more control signals to cause the pair of reverse-coupled inverters to generate the latched match signal from either a redundancy match signal or a test input signal, the redundancy match signal having a first logic level when the location address matches a known defective address and a second logic level when the location address does not match the known defective address;

wherein a logic level of the latched match signal is independent of the logic level of the redundancy match signal when the pair of reverse-coupled inverters generates the latched match signal from a test input signal; and wherein a logic level of the latched match signal is independent of a logic level of any test input signal when the pair of reverse-coupled inverters generates the latched match signal from the redundancy match signal.

21. The memory device of claim 20, wherein the primary and redundant groupings of memory cells comprise rows of memory cells.

22. The memory device of claim 20, wherein the memory array is an array of non-volatile memory cells.

23. A memory device, comprising:

a memory array having at least one primary grouping of memory cells and at least one redundant grouping of memory cells; and addressing circuitry coupled to the memory array for accessing a target memory cell in response to a location address applied to the memory device, wherein the addressing circuitry has a redundancy selection circuit, the redundancy selection circuit comprising:

a latch circuit having an input for receiving a redundancy match signal and an output for providing a latched match signal, the latch circuit comprising:

a pair of reverse-coupled inverters having a first inverter and a second inverter, wherein the first inverter has at least one test input, each for receiving a test input signal;

wherein the first inverter is responsive to one or more control signals to cause the pair of reverse-coupled inverters to generate the latched match signal from either a redundancy match signal or a test input signal;

wherein a logic level of the latched match signal is independent of the logic level of the redundancy match signal when the pair of reverse-coupled inverters generates the latched match signal from a test input signal; and wherein a logic level of the latched match signal is independent of a logic level of any test input signal when the pair of reverse-coupled inverters generates the latched match signal from the redundancy match signal;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

24. A memory device, comprising:

a memory array having at least one primary grouping of memory cells and at least one redundant grouping of memory cells; and addressing circuitry coupled to the memory array for accessing a target memory cell in response to a location address applied to the memory device, wherein the addressing circuitry has a redundancy selection circuit, the redundancy selection circuit comprising:

a latch circuit having an input for receiving a redundancy match signal and an output for providing a latched match signal, the latch circuit comprising:

a feedforward inverter having an input for receiving a first signal that is selectively either the redundancy match signal or a feedback signal, and an output for providing an inverted first signal as a feedforward signal, wherein the latched match signal is derived from the feedforward signal; and a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

25. A memory device, comprising:

a memory array having at least one primary grouping of memory cells and at least one redundant grouping of memory cells; and addressing circuitry coupled to the memory array for accessing a target memory cell in response to a location address applied to the memory device, wherein the addressing circuitry has a redundancy selection circuit, the redundancy selection circuit comprising:
  a latch circuit having an input for receiving a redundancy match signal and an output for providing a latched match signal, the latch circuit comprising:
    a NAND gate having a first input for receiving a first signal, a second input for receiving a second signal that is selectively either the redundancy match signal or a feedback signal, and an output for providing a feedforward signal, wherein the latched match signal is derived from the feedforward signal; and
    a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;
  a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and
  a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

26. A memory device, comprising:

a memory array having at least one primary grouping of memory cells and at least one redundant grouping of memory cells; and addressing circuitry coupled to the memory array for accessing a target memory cell in response to a location address applied to the memory device, wherein the addressing circuitry has a redundancy selection circuit, the redundancy selection circuit comprising:
  a latch circuit having an input for receiving a redundancy match signal and an output for providing a latched match signal, the latch circuit comprising:
    a multiplexer having an inverted first input for receiving a first signal that is selectively either the redundancy match signal or a feedback signal, at least one additional input each for receiving a test input signal, and an output for providing a feedforward signal, wherein the latched match signal is derived from the feedforward signal; and
    a feedback inverter having an input for receiving the feedforward signal and an output for providing the feedback signal as an inverted feedforward signal;
    wherein the multiplexer is responsive to at least one control signal to selectively couple its output to either its first input or one of the at least one additional inputs;
  a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and
  a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

27. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device, wherein the addressing circuitry selectively accesses either a primary grouping of memory cells or a redundant grouping of memory cells in response to a latched match signal from a latch circuit, the latch circuit comprising:
  a pair of reverse-coupled inverters having a first inverter and a second inverter, wherein the first inverter has at least one test input, each for receiving a test input signal;

wherein the first inverter is responsive to one or more control signals to cause the pair of reverse-coupled inverters to generate the latched match signal from either a redundancy match signal or a test input signal, the redundancy match signal having a first logic level when the location address matches a known defective address and a second logic level when the location address does not match the known defective address;

wherein a logic level of the latched match signal is independent of the logic level of the redundancy match signal when the pair of reverse-coupled inverters generates the latched match signal from a test input signal; and wherein a logic level of the latched match signal is independent of a logic level of any test input signal when the pair of reverse-coupled inverters generates the latched match signal from the redundancy match signal.

28. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device and commands generated by the command execution logic, wherein the addressing circuitry has a redundancy selection circuit, the redundancy selection circuit comprising:

a latch circuit having an input for receiving a redundancy match signal and an output for providing a latched match signal, the latch circuit comprising:

a pair of reverse-coupled inverters having a first inverter and a second inverter, wherein the first inverter has at least one test input, each for receiving a test input signal;

wherein the first inverter is responsive to one or more control signals to cause the pair of reverse-coupled inverters to generate the latched match signal from either the redundancy match signal or a test input signal;

wherein a logic level of the latched match signal is independent of a logic level of the redundancy match signal when the pair of reverse-coupled inverters generates the latched match signal from a test input signal; and wherein a logic level of the latched match signal is independent of a logic level of any test input signal when the pair of reverse-coupled inverters generates the latched match signal from the redundancy match signal;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

29. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device and commands generated by the command execution logic, wherein the addressing circuitry has a redundancy selection circuit, the redundancy selection circuit comprising:

a latch circuit having an input for receiving a redundancy match signal and an output for providing a latched match signal, the latch circuit comprising:

a feedforward inverter having an input for receiving a first signal that is selectively either the redundancy match signal or a feedback signal, and an output for providing an inverted first signal as a feedforward signal, wherein the latched match signal is derived from the feedforward signal; and a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

30. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device and commands generated by the command execution logic, wherein the addressing circuitry has a redundancy selection circuit, the redundancy selection circuit comprising:

a latch circuit having an input for receiving a redundancy match signal and an output for providing a latched match signal, the latch circuit comprising:

a NAND gate having a first input for receiving a first signal, a second input for receiving a second signal that is selectively either the redundancy match signal or a feedback signal, and an output for providing a feedforward signal, wherein the latched match signal is derived from the feedforward signal; and a multiplexer having an inverted first input, at least one additional input, and an output for providing the feedback signal, wherein the inverted first input is coupled to receive the feedforward signal and each additional input is coupled to receive a test input signal, further wherein the multiplexer is responsive to at least one control signal to selectively couple its output to either its first input or one of the at least one additional inputs;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

31. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device and commands generated by the command execution logic, wherein the addressing circuitry has a redundancy selection circuit, the redundancy selection circuit comprising:

a latch circuit having an input for receiving a redundancy match signal and an output for providing a latched match signal, the latch circuit comprising:

a multiplexer having an inverted first input for receiving a first signal that is selectively either the redundancy match signal or a feedback signal, at least one additional input each for receiving a test input signal, and an output for providing a feedforward signal, wherein the latched match signal is derived from the feedforward signal; and a feedback inverter having an input for receiving the feedforward signal and an output for providing the feedback signal as an inverted feedforward signal;

wherein the multiplexer is responsive to at least one control signal to selectively couple its output to either its first input or one of the at least one additional inputs;

a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level.

32. A synchronous flash memory assembly, comprising:

a memory package having a plurality of interconnects; and a synchronous flash memory device contained in the memory package, wherein the synchronous flash memory device comprises:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and addressing circuitry coupled to the array of non-volatile flash memory cells for accessing a target memory cell in response to a location address applied to the memory device, wherein the addressing circuitry selectively accesses either a primary grouping of memory cells or a redundant grouping of memory cells in response to a latched match signal from a latch circuit, the latch circuit comprising:
- a pair of reverse-coupled inverters having a first inverter and a second inverter, wherein the first inverter has at least one test input, each for receiving a test input signal;
- wherein the first inverter is responsive to one or more control signals to cause the pair of reverse-coupled inverters to generate the latched match signal from either a redundancy match signal or a test input signal, the redundancy match signal having a first logic level when the location address matches a known defective address and a second logic level when the location address does not match the known defective address;
- wherein a logic level of the latched match signal is independent of the logic level of the redundancy match signal when the pair of reverse-coupled inverters generates the latched match signal from a test input signal; and
- wherein a logic level of the latched match signal is independent of a logic level of any test input signal when the pair of reverse-coupled inverters generates the latched match signal from the redundancy match signal.

33. A synchronous flash memory assembly, comprising:
a memory package having a plurality of interconnects; and
a synchronous flash memory device contained in the memory package, wherein the synchronous flash memory device comprises:
- an array of non-volatile flash memory cells having at least one primary grouping of memory cells and at least one redundant grouping of memory cells;
- a command execution logic coupled to the array of non-volatile flash memory cells for receiving at least a system clock input signal and for generating commands to control operations performed on the array of non-volatile flash memory cells, wherein the commands are synchronized to the system clock input signal; and
- addressing circuitry coupled to the array of non-volatile flash memory cells for accessing a target memory cell in response to a location address applied to the memory device and commands generated by the command execution logic, wherein the addressing circuitry has a redundancy selection circuit, the redundancy selection circuit comprising:
  - a latch circuit having an input for receiving a redundancy match signal and an output for providing a latched match signal, the latch circuit comprising:
    - a pair of reverse-coupled inverters having a first inverter and a second inverter, wherein the first inverter has at least one test input, each for receiving a test input signal;
    - wherein the first inverter is responsive to one or more control signals to cause the pair of reverse-coupled inverters to generate the latched match signal from either the redundancy match signal or a test input signal;
    - wherein a logic level of the latched match signal is independent of a logic level of the redundancy match signal when the pair of reverse-coupled inverters generates the latched match signal from a test input signal; and
    - wherein a logic level of the latched match signal is independent of a logic level of any test input signal when the pair of reverse-coupled inverters generates the latched match signal from the redundancy match signal;
  - a redundant element access device, wherein the redundant element access device is responsive to the latched match signal to access a redundant grouping of memory cells when the latched match signal has a first logic level and to suppress access to the redundant grouping of memory cells when the latched match signal has a second logic level, further wherein the latched match signal has the first logic level when the location address matches a known defective address and has the second logic level when the location address does not match a known defective address; and
  - a primary element access device, wherein the primary element access device is responsive to a second control signal to selectively access a primary grouping of memory cells when the latched match signal has the second logic level and wherein access to the primary grouping of memory cells by the primary element access device is suppressed regardless of a logic level of the second control signal when the latched match signal has the first logic level;
- address inputs coupled between the memory array and a first portion of the plurality of interconnects of the memory package;
- data inputs/outputs coupled between the memory array and a second portion of the plurality of interconnects of the memory package;
- power inputs coupled between the memory array and a third portion of the plurality of interconnects of the memory package;
- clock and control signal inputs coupled between the memory array and a fourth portion of the plurality of interconnects of the memory package; and
- a command execution logic coupled to the memory array for receiving at least a system clock input signal from the clock and control signal inputs and for generating commands to control operations performed on the memory array synchronized to the system clock input signal.

34. An electronic system, comprising:
a processor; and
a memory device coupled to the processor, wherein the memory device comprises:
- a memory array having at least one primary grouping of memory cells and at least one redundant grouping of memory cells; and
- addressing circuitry coupled to the memory array for accessing a target memory cell in response to a location address applied to the memory device from the processor, wherein the addressing circuitry selectively accesses either a primary grouping of memory cells or a redundant grouping of memory cells in response to a latched match signal from a latch circuit, the latch circuit comprising:
  - a pair of reverse-coupled inverters having a first inverter and a second inverter, wherein the first inverter has at least one test input, each for receiving a test input signal;
  - wherein the first inverter is responsive to one or more control signals to cause the pair of reverse-coupled inverters to generate the latched match signal from either a redundancy match signal or a test input signal, the redundancy match signal having a first logic level when the location address matches a known defective address and a second logic level when the location address does not match the known defective address;

wherein a logic level of the latched match signal is independent of the logic level of the redundancy match signal when the pair of reverse-coupled inverters generates the latched match signal from a test input signal; and wherein a logic level of the latched match signal is independent of a logic level of any test input signal when the pair of reverse-coupled inverters generates the latched match signal from the redundancy match signal.

35. A method of operating a memory device, comprising:

latching a redundancy match signal in a reverse-coupled inverter latch, thereby generating a feedback signal and a feedforward signal, wherein the redundancy match signal is indicative of a desire of whether to access a primary grouping of memory cells;

generating the feedforward signal from the feedback signal and selectively generating the feedback signal from either a test signal or the feedforward signal in response to a control signal;

generating a latched match signal from the feedforward signal; and selectively accessing either the primary grouping of memory cells or a redundant grouping of memory cells in response to the latched match signal.

36. The method of claim 35, wherein the method is performed in the order presented.

37. A method of operating a memory device, comprising:

latching a redundancy match signal in a reverse-coupled inverter latch, thereby generating a feedback signal and a feedforward signal, wherein the redundancy match signal is indicative of a desire of whether to access a primary grouping of memory cells;

generating the feedback signal from the feedforward signal and selectively generating the feedforward signal from either a test signal or the feedback signal in response to a control signal;

generating a latched match signal from the feedforward signal; and selectively accessing either the primary grouping of memory cells or a redundant grouping of memory cells in response to the latched match signal.

38. The method of claim 37, wherein the method is performed in the order presented.

* * * * *